(12) United States Patent
Self et al.

(10) Patent No.: US 6,783,371 B2
(45) Date of Patent: Aug. 31, 2004

(54) SOLDER-DOWN PRINTED CIRCUIT BOARD CONNECTION STRUCTURE

(75) Inventors: Bobby J Self, Colorado Springs, CO (US); Clarence Keith Griggs, Colorado Springs, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 09/836,753

(22) Filed: Apr. 17, 2001

(65) Prior Publication Data

US 2002/0151193 A1 Oct. 17, 2002

(51) Int. Cl.[7] .............................................. H01R 12/00
(52) U.S. Cl. ............................ 439/67; 439/65; 439/493
(58) Field of Search ............................ 439/67, 65, 493, 439/492

(56) References Cited

U.S. PATENT DOCUMENTS

| | | | | |
|---|---|---|---|---|
| 3,707,696 A | * | 12/1972 | Carter | 339/17 |
| 4,087,146 A | * | 5/1978 | Hudson, Jr. | 439/493 |
| 4,609,240 A | * | 9/1986 | Pistor | 439/259 |
| 4,812,135 A | * | 3/1989 | Smith | 174/117 F |
| 4,934,943 A | * | 6/1990 | Klein et al. | 29/834 |
| 5,692,911 A | * | 12/1997 | Webster et al. | 324/754 |
| 5,764,497 A | * | 6/1998 | Mizumo | 257/776 |
| 6,017,222 A | * | 1/2000 | Kao | 439/493 |
| 6,053,747 A | * | 4/2000 | Aggus et al. | 439/628 |
| 6,139,360 A | * | 10/2000 | Hayashi et al. | 439/502 |
| 6,162,099 A | * | 12/2000 | Wu | 439/638 |
| 6,238,237 B1 | * | 5/2001 | Nagahata et al. | 439/493 |
| 6,247,977 B1 | * | 6/2001 | Tanaka et al. | 439/492 |
| 6,261,104 B1 | * | 7/2001 | Leman | 439/61 |
| 6,302,705 B1 | * | 10/2001 | Yatskov et al. | 439/67 |
| 6,305,970 B1 | * | 10/2001 | Nagai et al. | 439/422 |
| 6,309,223 B1 | * | 10/2001 | Wolfe | 439/67 |
| 6,336,816 B1 | * | 1/2002 | Yatskov et al. | 439/493 |

* cited by examiner

Primary Examiner—Gary Paumen
Assistant Examiner—Edwin A. Leon
(74) Attorney, Agent, or Firm—Kyle J. Way

(57) ABSTRACT

An electrical connection structure terminates an electrical signal wire while electrically coupling the wire to a target circuit board. A rigid printed circuit board or flex circuit is attached in a substantially perpendicular orientation to the target board by way of solder. A termination circuit is then mounted near the end of the rigid board or flex circuit that is attached to the target circuit board, with the termination circuit electrically coupling the signal wire with the target circuit board.

15 Claims, 6 Drawing Sheets

SOLDER-DOWN PRINTED CIRCUIT BOARD CONNECTION STRUCTURE

BACKGROUND OF THE INVENTION

With electronic signal switching speeds currently in the gigahertz range and still increasing, the mechanical technology employed to route high-speed signals around an electronic system has struggled to keep pace. The task of routing these signals by way of cables between different printed circuit boards (PCBs) has been especially troublesome. Generally speaking, standard PCB cable connectors have been used to attach signal wires to PCBs. However, in some applications, such connectors cause problems that are exacerbated by the switching speeds of electronic signals encountered today.

For example, as shown in FIG. 1, the task of probing signals in an electronic system today with test equipment, such as oscilloscopes and logic analyzers, oftentimes requires the use of a PCB connector 100 to attach coaxial test equipment probes 110 to a target circuit card 120 containing the signal lines to be probed. Termination circuits (not shown in FIG. 1) are typically employed within a probe cable connector housing 130 so that the operation of the signals under test are not adversely affected by the transmission line stubs formed by the probes. Unfortunately, the use of connectors creates at least two problems in such applications. First, the probe termination circuits, being resident in cable connector housing 130, are typically located several millimeters away from the point at which probes 110 couple with the signals under test on target circuit board 120, due to the length of the conductive material required to traverse the connector. As shown in FIG. 2, which is a schematic representation of the connector configuration of FIG. 1, a transmission line stub 200 exists between termination circuit 210 (comprising a parallel configuration of a resistor $R_1$ and a capacitor $C_1$) and the probed signal on target circuit board 120. The faster the switching speed of the signal under test, the more that transmission line stub 200 will affect the signal's operation by way of unwanted signal reflections. Second, PCB connector 100 (of FIG. 1) occupies valuable board space that could be allocated to other functional circuitry. This space consideration becomes an important issue as the functional capacity of integrated circuits (ICs) continues to increase, making each square inch on target circuit board 120 capable of holding even more circuitry than before.

As a result, the use of a connection structure for attaching signal wires to a PCB that reduces the amount of board space allocated to that structure on the PCB, as well as allows any necessary termination circuits to be located close to the PCB, would be advantageous. Such a device would be desirable for high-speed, high-density applications, such as, for example, circuit probing with oscilloscopes and logic analyzers, due to the associated improvements in target board space efficiency and signal integrity.

SUMMARY OF THE INVENTION

Specific embodiments according to the present invention, to be described herein, provide an effective structure for coupling a signal wire and associated termination circuit to a target printed circuit board without the use of a standard connector configuration. An electrical circuit substrate, capable of carrying components and connecting them to other signal wires, is attached perpendicularly to the target circuit board using solder for electrical connectivity and mechanical stability. The termination circuit, electrically coupled to both the signal wire and the target circuit board, resides on the electrical circuit substrate near the end that is coupled with the target circuit board. This positioning is employed to minimize the distance between the termination circuit and the signal on the target circuit board to which the termination circuit is connected. Specific embodiments of the invention involve the use of a rigid circuit board or a flex circuit as the electrical circuit substrate.

Other aspects and advantages of the invention will become apparent from the following detailed description, taken in conjunction with the accompanying drawings, illustrating by way of example the principles of the invention.

BRIEF DESCRIPTION OF THE DRAWINGS

FIG. 3A is a close-up perspective view of a termination circuit of FIG. 3.

DETAILED DESCRIPTION

The structural basis of connection structure 300 (shown in FIG. 3), as well as other embodiments of the invention, is an electrical circuit substrate. An electrical circuit substrate is a physical medium upon which electrical components, such as resistors and capacitors, can be mounted. The substrate also facilitates the connection of those components via connection pads or similar means with other electrical wires and components. Two examples of an electrical circuit substrate include rigid circuit boards and the various types of flex circuits commonly available in the electronics industry.

Figure 3:
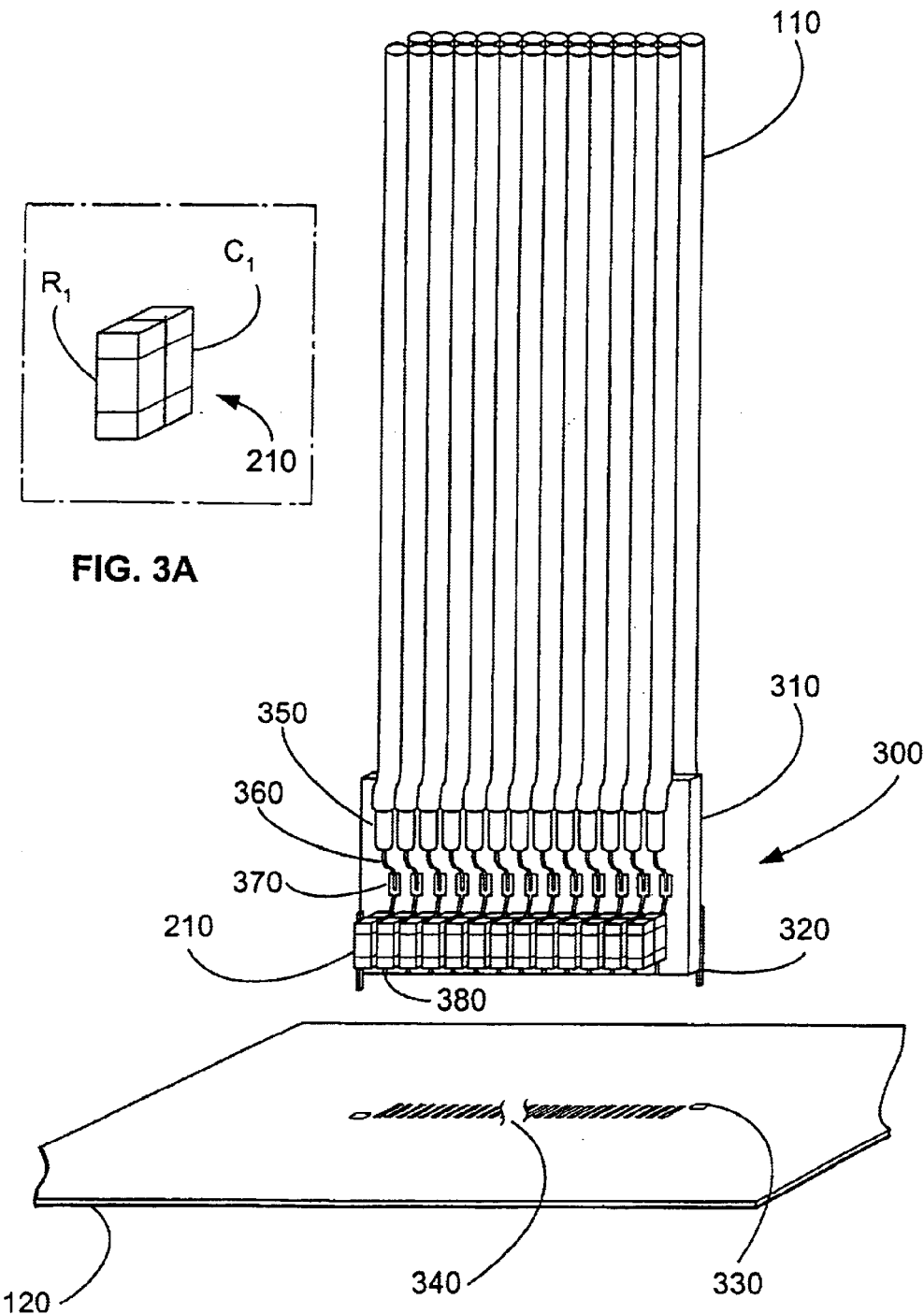
FIG. 3 is a perspective view of a test equipment probe connection utilizing a rigid circuit board according to an embodiment of the invention.

As shown in FIG. 3, connection structure 300 connects coaxial test equipment probes 110 to target circuit card 120 containing signals (not shown) to be probed. Other types of electrical signal wires that are not coaxial in nature, such as standard single-ended or differential wire interfaces, may also be connected to PCBs using the principles exemplified by the embodiment of FIG. 3. Also, electrical signal wires may include the printed wires of a PCB.

Connection structure 300 utilizes a rigid circuit board 310 as an electrical circuit substrate to which coaxial probes 110 are attached. Signal wires 360 are soldered to pads 370 of rigid circuit board 310. Exposed shields 350 of coaxial probes 110 also may be soldered down to rigid circuit board 310. Termination circuits 210, which in this case consist of parallel resistor-capacitor (R-C) networks with component values that are appropriate for the particular application in which connection device 300 is employed, are soldered to rigid circuit board 310, electrically coupling signal wires 360 of probes 110 with solder points 380. Other termination circuits that are appropriate for a particular application, including those circuits employing active electrical components, such as transistors, may also be employed.

In the particular embodiment of FIG. 3, the R-C parallel configuration of termination circuit 210 is formed by stacking resistor $R_1$ and capacitor $C_1$ on top of each other, as shown in FIG. 3A, to reduce the space allocated to each termination circuit 210 on rigid circuit board 310. While such measures enhance the ability to place termination circuits 210 near target circuit board 120, stacking may not be necessary in other embodiments. For example, a termination circuit that consists of a single resistor would not involve component stacking.

FIG. 3 shows coaxial probes 110 being attached to both sides of rigid circuit board 310, thus using the area on both sides of rigid circuit board 310 efficiently. Conversely, other embodiments may utilize only one side of rigid circuit board 310 for termination circuits 210 and the connections necessary to couple coaxial probes 110 with target circuit board 120.

In the embodiment of FIG. 3, solder points 380 on rigid circuit board 310 are soldered to pads 340 on target circuit board 120. To aid in aligning rigid circuit board 310 with pads 340, guide pins 320 on rigid circuit board 310 protrude through alignment holes 330 on target circuit board 120. Guide pins 320 may then be soldered to target circuit board 120 for stability while solder points 380 are soldered to pads 240, thus connecting probes 110 with the signal lines to be probed on target circuit board 120 via termination circuits 210. Other methods of electrically coupling the edge of one circuit board to the side of another without the use of standard connector technology may also be employed. Such methods must allow termination circuits 210 to reside close to the edge of rigid circuit board 310 that is attached to target circuit board 120.

Figure 4:
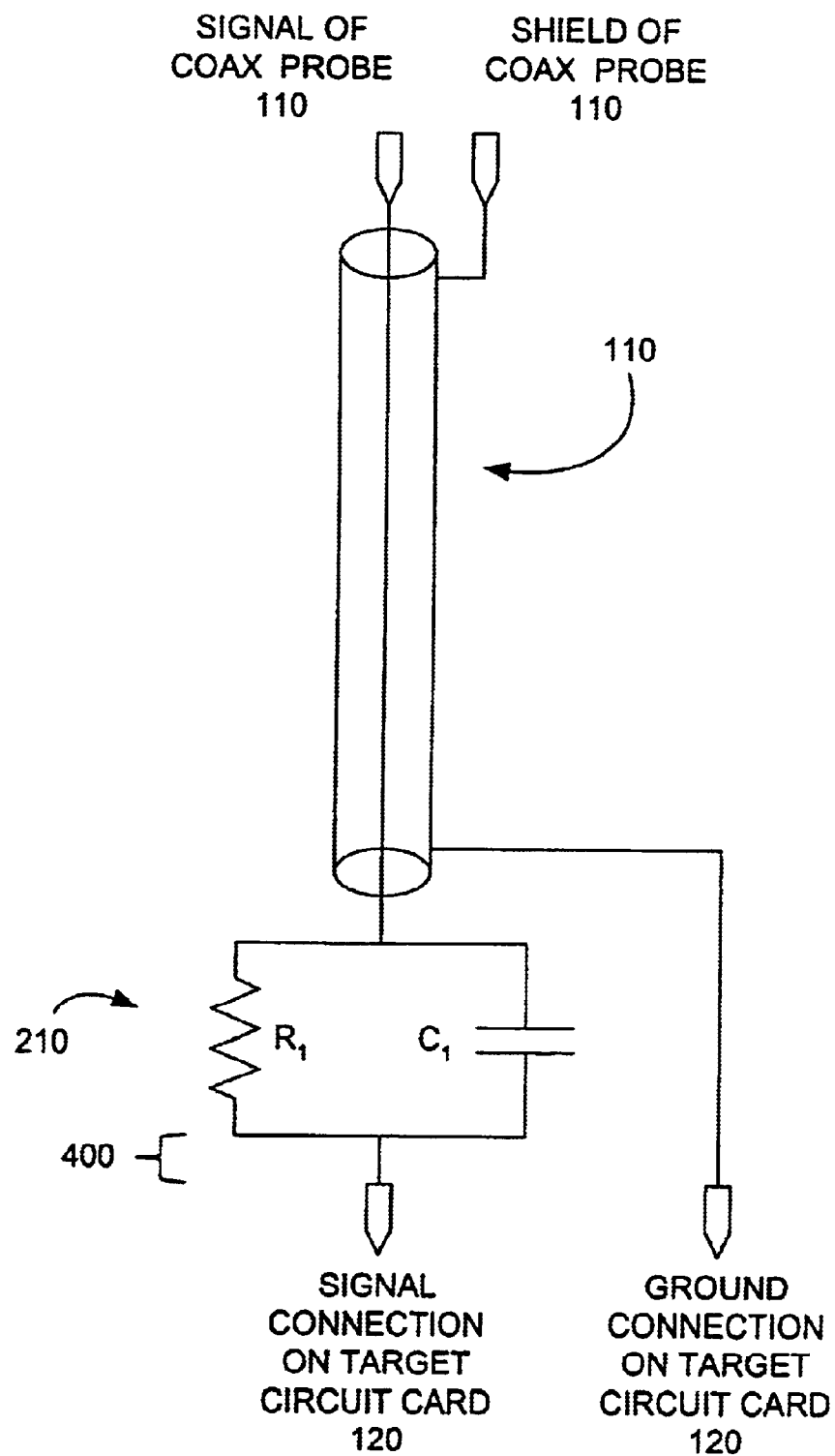
FIG. 4 is a simplified schematic representation of the test equipment probe connection of FIG. 3.

Placement of termination circuits 210 close to the bottom, or proximate, end of rigid circuit board 310 serves to minimize the distance between termination networks 210 and target circuit board 120. Minimizing this distance reduces the length of the associated transmission line stub between termination networks 210 and the signal on target circuit board 120 that is being probed. Shown in the schematic of FIG. 4, reduced length transmission line stub 400 is significantly shorter than transmission line stub 200 from FIG. 2, which is associated with the connector scheme of FIG. 1. A shorter line stub exhibits better signal reflection characteristics for the signal on target circuit board 120 that is being probed. These characteristics become more important as the switching frequency of the signal being probed increases. Limiting unwanted reflections in the signal being probed reduces the amount that signal is adversely affected by probing, making the resulting measurements more accurate.

Figure 1:
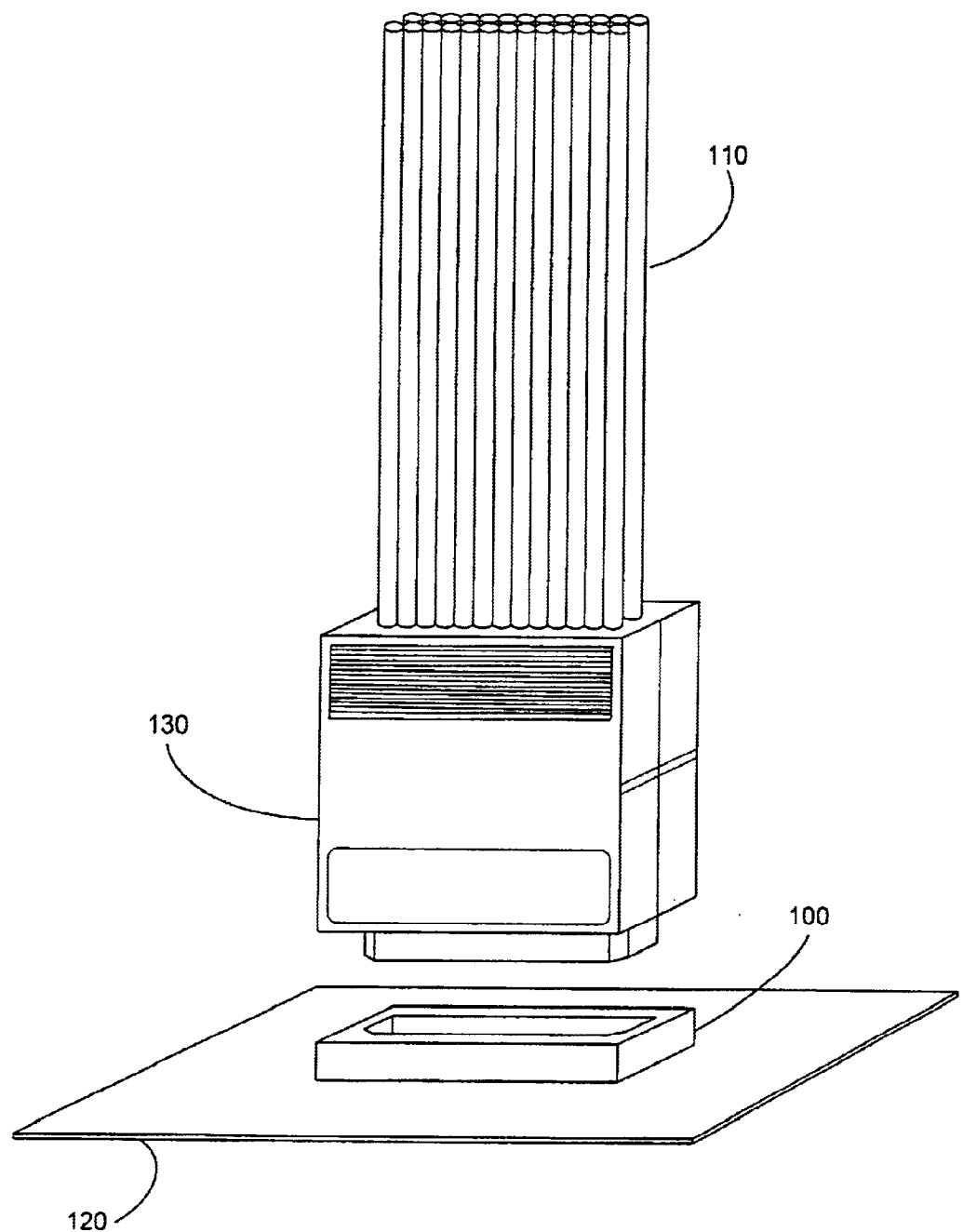
FIG. 1 is a perspective view of a typical test equipment probe connection with a target circuit board utilizing a standard PCB connector according to the prior art.
Figure 2:
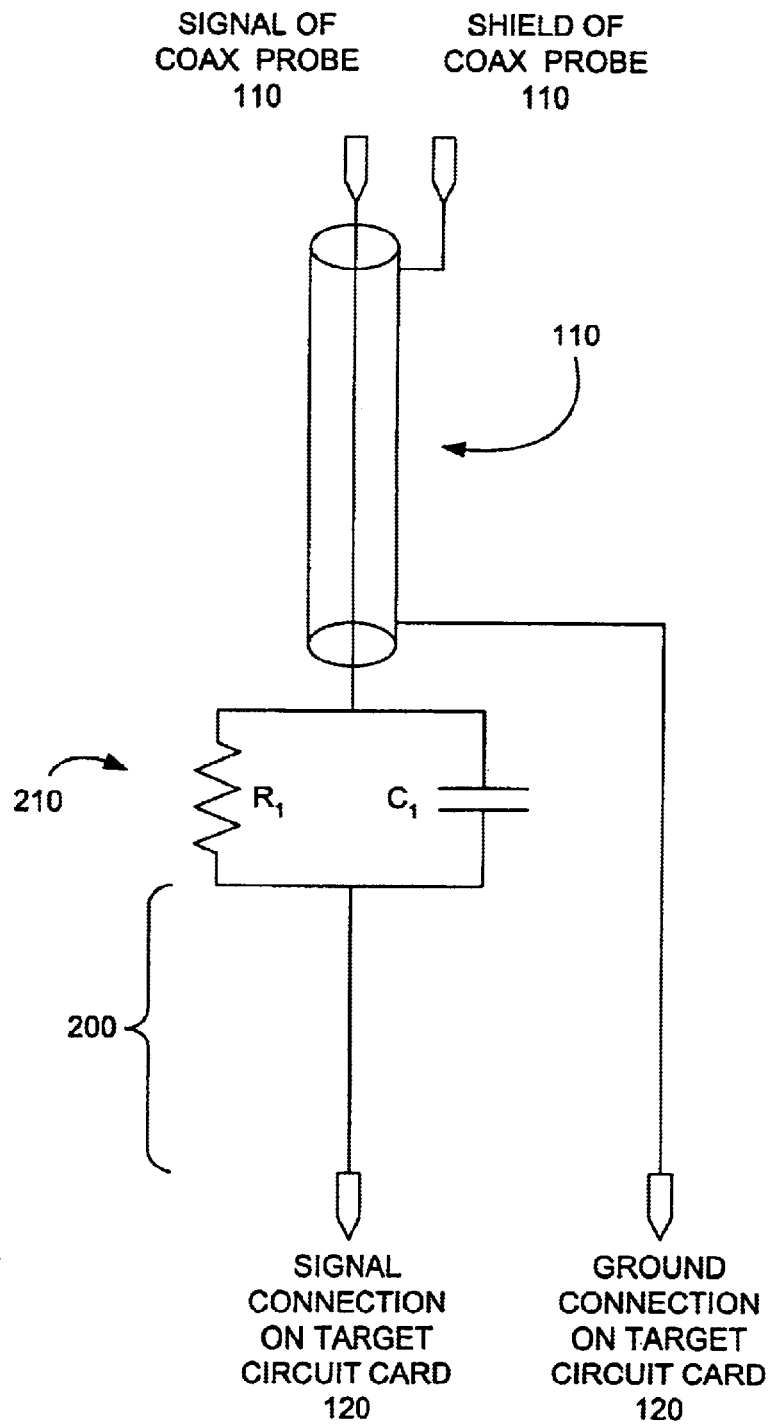
FIG. 2 is a simplified schematic representation of the test equipment probe connection of FIG. 1.

Additionally, connection structure 300 and other embodiments of the invention generally occupy less board space on target circuit board 120 than connection schemes in the prior art, such as PCB connector 100 of FIG. 1. Saving board space is critical in many applications. For instance, in the case of FIG. 3, coaxial probes 110 are typically used only for testing during the design and development of target circuit board 120, and are not employed in the final version of the product. As a result, any space used in connecting probes 110 to target circuit board 120 is not available for circuitry that would be used in the normal operation of the product.

Figure 5:
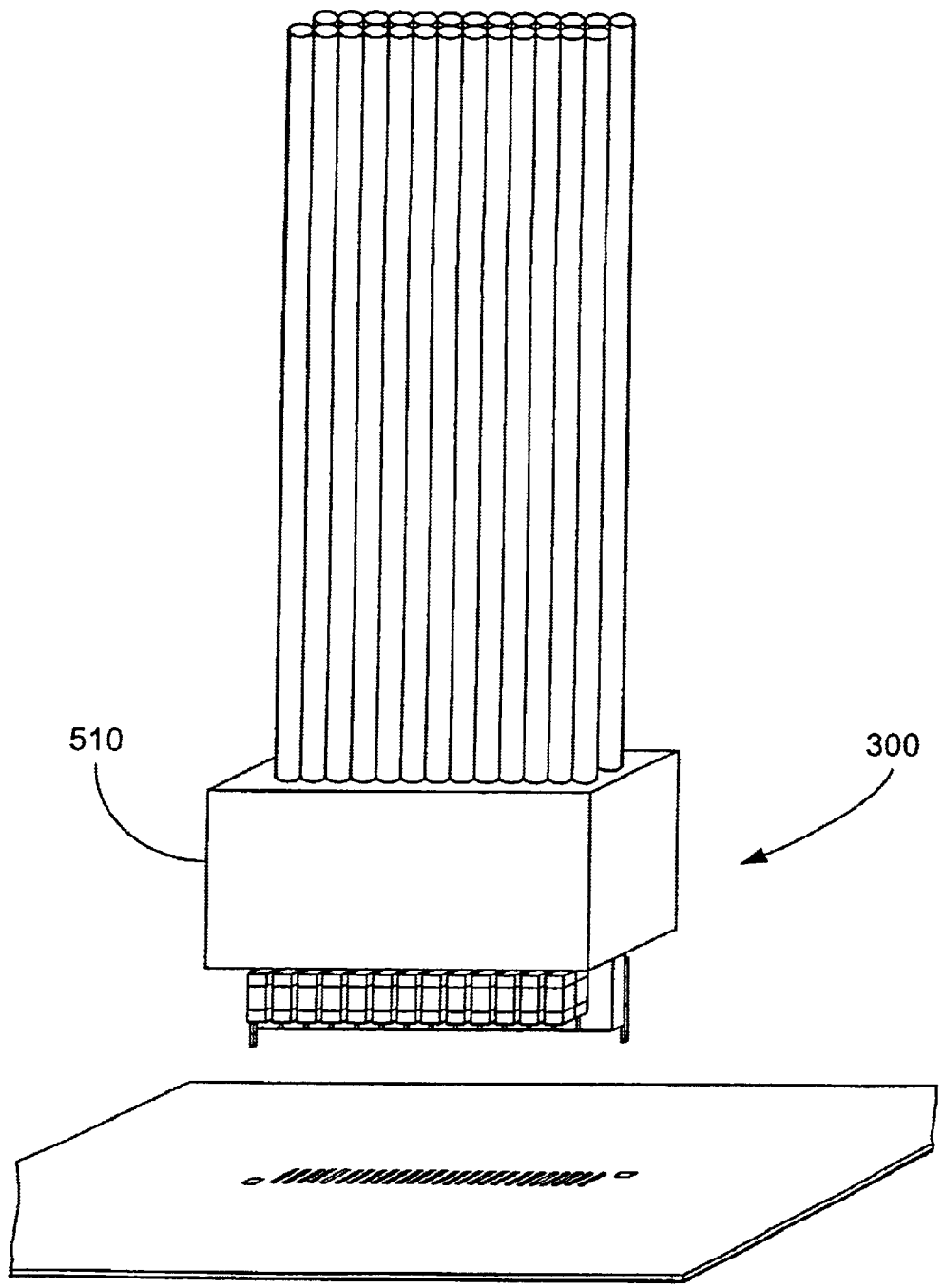
FIG. 5 is a perspective view of the test equipment probe connection of FIG. 3 employing a protective cover.

To shelter selected portions of connection structure 300, a protective cover 510 may be employed, as shown in FIG. 5. In this embodiment, formerly exposed shields 350 and signal wires 360 (of FIG. 3) are protected from any accidental damage that might otherwise occur during the handling of connection structure 300. Protective cover 510 may be manufactured from vinyl or any other material suitable for the particular application.

The use of embodiments of the present invention will also apply to applications outside of the electrical test and measurement arena. Any high-performance electronic system that requires the coupling of terminated wires to PCBs would benefit from the shorter transmission line stubs provided by the embodiments herein disclosed. For example, such wires could carry high-speed signals within the system from one PCB to another. Also, wires connecting interface signals between one electronic system and another could be coupled to PCBs at either or both ends using the disclosed embodiments of the present invention.

Figure 6:
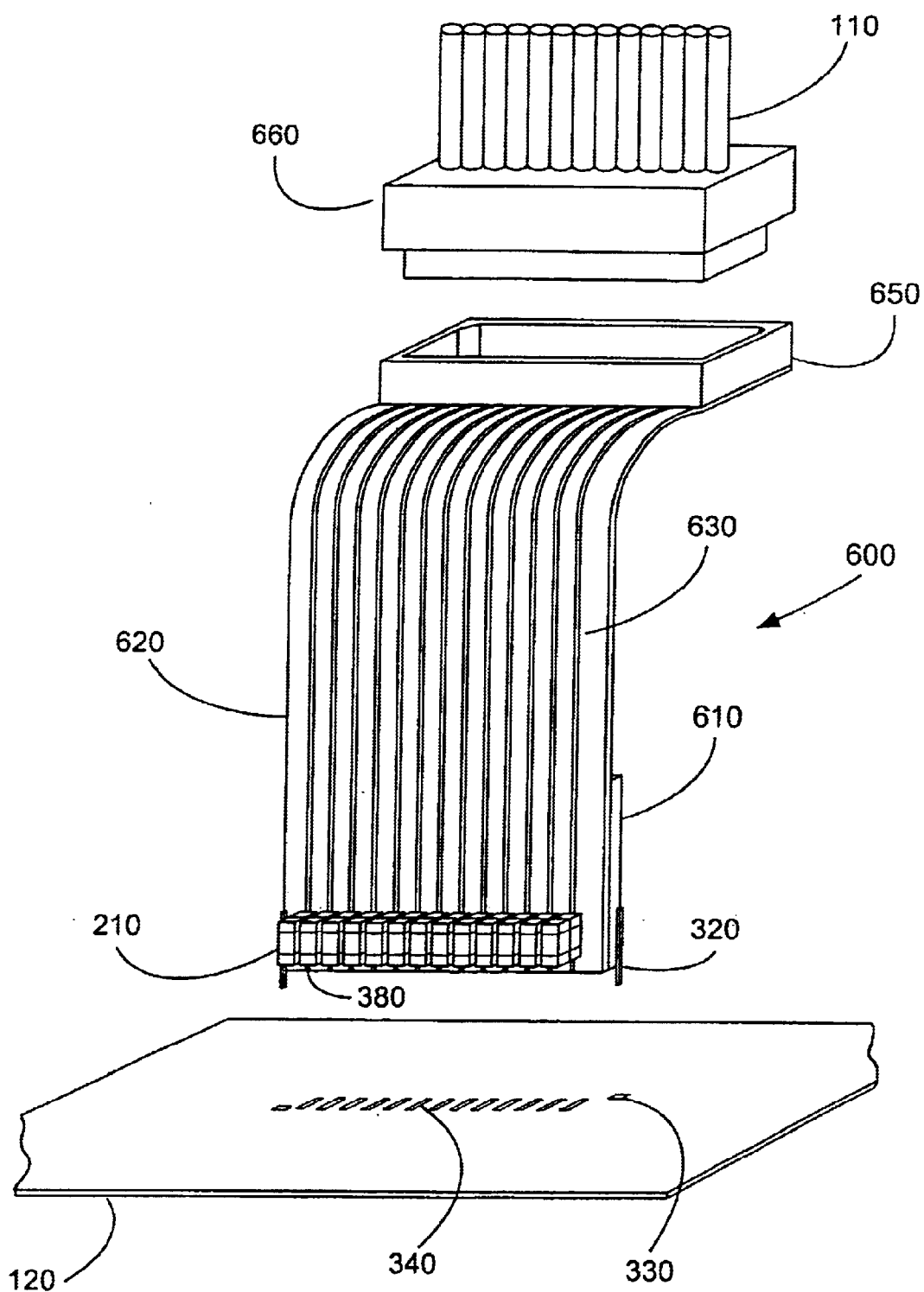
FIG. 6 is a perspective view of a test equipment probe connection utilizing a flex circuit according to an embodiment of the invention.

Another embodiment of the invention, connection structure 600, shown in FIG. 6, utilizes flex circuit technology instead of a rigid circuit board. Flex circuit 620, carrying flexible signal wires 630, is attached to a rigid board 610 for additional stability at the area of connection with target circuit board 120. A rigidized flex, or "rigid flex," configuration, well known in the electronics industry, is another example of such an assembly that may be used in the proposed connection scheme. Termination circuits 210, which couple flexible signal wires 630 with solder points 380, are located near the proximate end of flex circuit 620 that couples with pads 340 of target circuit board 120, thereby reducing the transmission line stub existing between termination circuits 210 and target circuit board 120. Additionally, guide pins 320 of connection structure 600 and alignment holes 330 of target circuit board 120 are used to stabilize the connection between connection structure 600 and target circuit board 120 during and after soldering pads 340 with solder points 380.

Flexible signal wires 630 at the end of connection structure 600 opposite the proximate end are coupled with coaxial probes 110 by way of a socket 650, which is capable of receiving a mating plug 660 attached to coaxial probes 110. In other flex circuit embodiments, other commonly used methods of connecting flex circuits with wire cables may also be employed. Additionally, flexible signal wires 630 may be coupled more directly with electrical signal wires resident on another PCB (not shown), possibly by way of a standard flex circuit zero-insertion-force (ZIF) connector on the other PCB.

What is claimed is:

1. An electrical connection structure for terminating an electrical signal wire and electrically coupling the electrical signal wire to a target circuit board, comprising:

an electrical circuit substrate to which the electrical signal wire is coupled, the electrical circuit substrate having a proximate end being coupled via solder directly to the target circuit board in the absence of an intervening connector, the electrical circuit substrate being substantially perpendicular to the target circuit board; and a termination circuit mounted substantially at the proximate end of the electrical circuit substrate, the termination circuit being electrically coupled to the electrical signal wire and the target circuit board, the termination circuit being configured to limit signal reflections on the electrical signal wire.

2. The electrical connection structure of claim 1, wherein the electrical circuit substrate is a rigid circuit board.

3. The electrical connection structure of claim 2, further comprising:

a guide pin connected to the rigid circuit board, the guide pin protruding through a corresponding alignment hole in the target circuit board.

4. The electrical connection structure of claim 2, wherein the termination circuit comprises at least two stacked passive electrical surface-mount components.

5. The electrical connection structure of claim 2, wherein the termination circuit comprises an active electrical component.

6. The electrical connection structure of claim 2, wherein at least one electrical signal wire may be connected to either side of the rigid circuit board.

7. The electrical connection structure of claim 2, wherein the electrical signal wire is a coaxial signal wire having a shield electrically coupled to the rigid circuit board.

8. The electrical connection structure of claim 2, further comprising a protective cover that at least partially encloses the rigid circuit board.

9. The electrical connection structure of claim 1, wherein the electrical circuit substrate is a flex circuit.

10. The electrical connection structure of claim 9, further comprising:

a rigid board attached alongside the flex circuit at the proximate end opposite the side of the flex circuit where the termination circuit is mounted.

11. The electrical connection structure of claim 9, further comprising:

a socket connected to the flex circuit, the socket being capable of receiving a mating plug to which the electrical signal wire is connected.

12. The electrical connection structure of claim 9, further comprising:

a guide pin connected to the flex circuit, the guide pin protruding through a corresponding alignment hole in the target circuit board.

13. The electrical connection structure of claim 9, wherein the termination circuit comprises at least two stacked passive electrical surface-mount components.

14. The electrical connection structure of claim 9, wherein the termination circuit comprises an active electrical component.

15. The electrical connection structure of claim 9, wherein the flex circuit is a rigidized flex circuit.

* * * * *